US008884901B2

(12) United States Patent
Landau et al.

(10) Patent No.: US 8,884,901 B2
(45) Date of Patent: Nov. 11, 2014

(54) SHAPED CAPACITIVE TOUCH SENSOR, DEVICES, AND METHODS OF USE

(75) Inventors: Steven A. Landau, New York, NY (US); Zachary E. Eveland, Brooklyn, NY (US)

(73) Assignee: Touch Graphics, Inc., Hillsdale, NJ (US)

( * ) Notice: Subject to any disclaimer, the term of this patent is extended or adjusted under 35 U.S.C. 154(b) by 121 days.

(21) Appl. No.: 13/552,227

(22) Filed: Jul. 18, 2012

(65) Prior Publication Data
US 2013/0021278 A1 Jan. 24, 2013

Related U.S. Application Data

(60) Provisional application No. 61/509,394, filed on Jul. 19, 2011.

(51) Int. Cl.
*G09G 5/00* (2006.01)
*H03K 17/96* (2006.01)
*G06F 3/044* (2006.01)

(52) U.S. Cl.
CPC ...... *G06F 3/044* (2013.01); *G06F 2203/04809* (2013.01); *H03K 17/962* (2013.01); *H03K 2017/9602* (2013.01)
USPC ...... 345/173; 345/174; 178/18.01; 178/18.06

(58) Field of Classification Search
USPC ............ 345/173–178; 178/18.01–18.06
See application file for complete search history.

(56) References Cited

U.S. PATENT DOCUMENTS

| 7,113,177 | B2 * | 9/2006 | Franzen | 345/173 |
| 7,683,891 | B2 * | 3/2010 | Tran | 345/173 |
| 8,537,133 | B2 * | 9/2013 | Trachte | 345/173 |
| 2008/0246735 | A1 * | 10/2008 | Reynolds et al. | 345/173 |
| 2010/0259503 | A1 * | 10/2010 | Yanase et al. | 345/174 |
| 2011/0285640 | A1 * | 11/2011 | Park et al. | 345/173 |
| 2012/0038583 | A1 * | 2/2012 | Westhues et al. | 345/174 |

\* cited by examiner

*Primary Examiner* — Jennifer Nguyen
(74) *Attorney, Agent, or Firm* — Ulmer & Berne LLP

(57) ABSTRACT

Touch sensors and associated systems and methods are disclosed. The amount of skin of a user's finger that touches the touch sensor changes in relation to the intensity or pressure applied by the finger. A variable control signal is generated proportional to the pressure applied to the touch sensor.

20 Claims, 9 Drawing Sheets

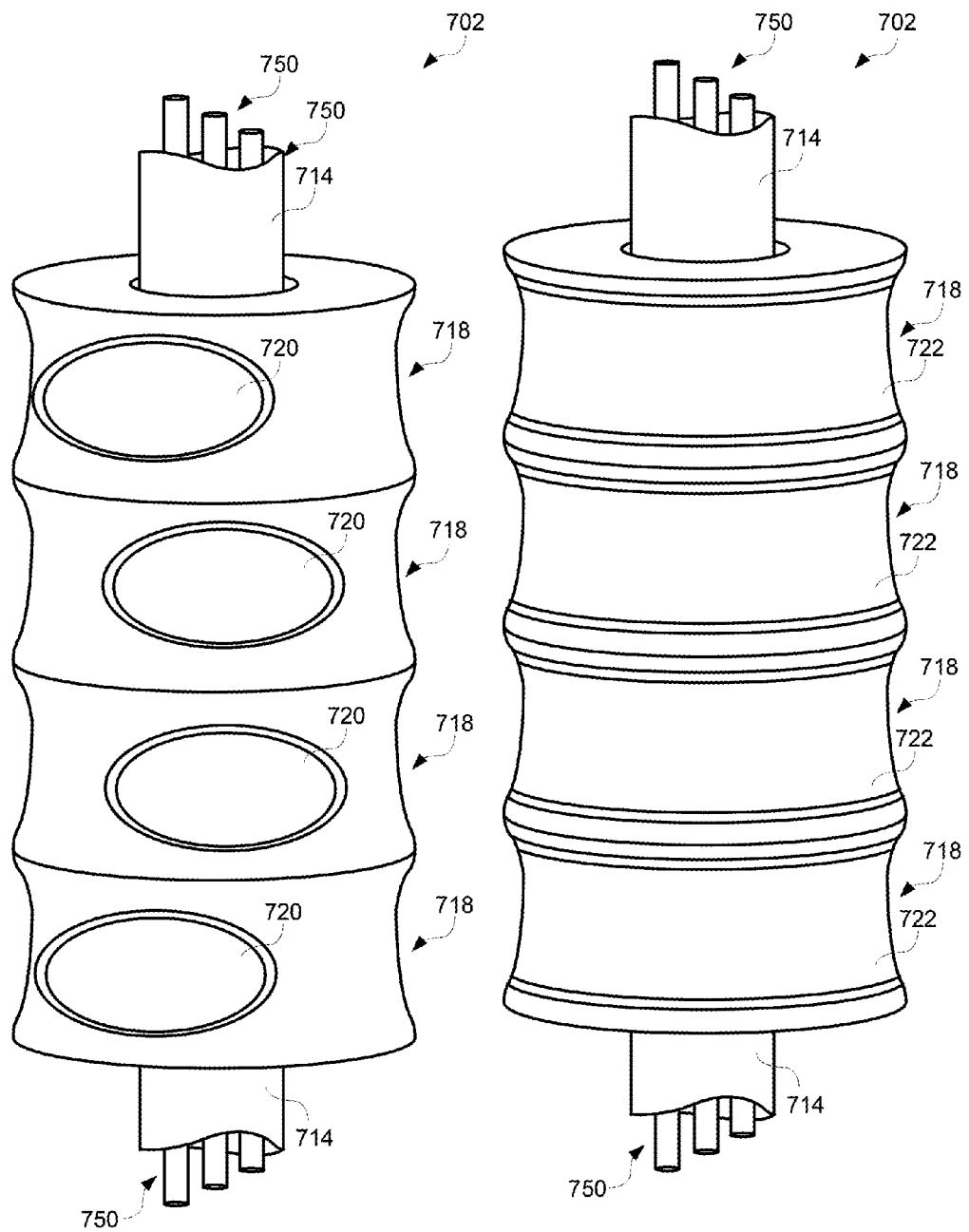
FIGURE 7b                    FIGURE 7c

SHAPED CAPACITIVE TOUCH SENSOR, DEVICES, AND METHODS OF USE

CROSS-REFERENCE TO RELATED APPLICATIONS

This application claims priority to the disclosure of U.S. Provisional Patent Application Ser. No. 61/509,394, entitled SHAPED CAPACITIVE TOUCH SENSOR, DEVICES, AND METHODS OF USE, filed Jul. 19, 2011, the disclosure of which is incorporated herein by reference in its entirety.

TECHNICAL FIELD

The device, methods, and systems described below relate generally to the field of touch sensors and methods of interacting with computing devices. More particularly, those devices, methods and systems relate to shaped capacitive sensors having haptic feedback.

BACKGROUND

Electronics systems typically have a user controls that allows a user to interact and control the electronics system. Computing systems typically have a user interface such as a graphical user interface, or GUI, that allows the user to command the operation of the computing system using a mouse and keyboard. The keyboard allows a user to enter data in either text or numerical formats and the manipulating the mouse moves a cursor in the GUI and allows selection functions. Many consumer electronics systems have physical controls that can be pushed or manipulated to control the electronics systems. Some consumer devices have wired or wireless interfaces that permit remote operation, such as infrared remote controls and receivers that use the Infrared Data Association (IrDA) protocol.

BRIEF DESCRIPTION OF THE DRAWINGS

The present disclosure will be more readily understood from a detailed description of some example embodiments taken in conjunction with the following figures:

FIG. 6b is a side view diagram of the test configurations of shaped capacitive touch sensors of FIG. 6a.

FIGS. 7b and 7c are perspective diagrams of example control devices.

DETAILED DESCRIPTION

Various non-limiting embodiments of the present disclosure will now be described to provide an overall understanding of the principles of the structure; function, and use of the touch sensor systems and methods disclosed herein. One or more examples of these non-limiting embodiments are illustrated in the accompanying drawings. Those of ordinary skill in the art will understand that systems and methods specifically described herein and illustrated in the accompanying drawings are non-limiting embodiments. The features illustrated or described in connection with one non-limiting embodiment may be combined with the features of other non-limiting embodiments. Such modifications and variations are intended to be included within the scope of the present disclosure.

As disclosed herein, the shaped capacitive touch sensor 100 and devices using shaped capacitive touch sensors 100 provide systems and methods for measuring touch intensity and present novel methods of interacting with and controlling electronic systems. Those of ordinarily skilled in the art area will recognize from reading the description that the device, methods, and systems described herein can be applied to, or easily modified for use with, other types of equipment. Like reference numbers are intended to refer to, the same or similar items.

Although described as a shaped capacitive touch sensor 100, those familiar in the art will recognize that the sensor and disclosed systems and methods may be applicable to resistive sensors, surface acoustic wave sensors, dispersive signal sensors, acoustic pulse recognition sensors, optical sensors, and capacitive sensors of various types including, but not limited to, surface capacitive sensors, projected capacitance sensors, mutual capacitive sensors, and self-capacitive sensors.

Figure 1:
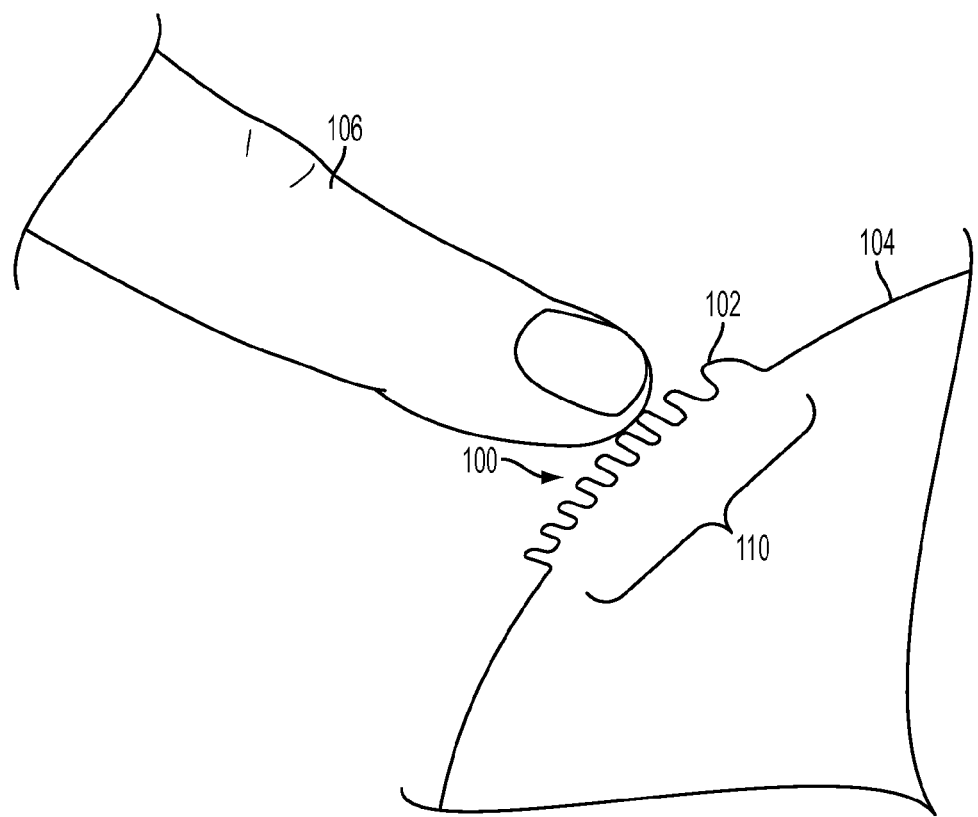
FIG. 1 is a diagram of a shaped capacitive touch sensor in an embodiment of the disclosure.
Figure 2A:
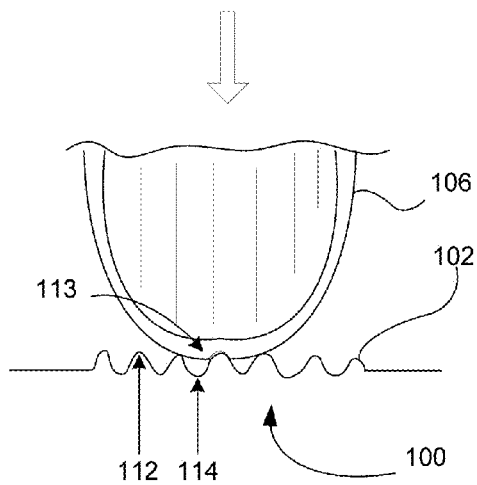
FIG. 2a is a diagram of a finger touching a shaped capacitive touch sensor in an embodiment of the disclosure.
Figure 2B:
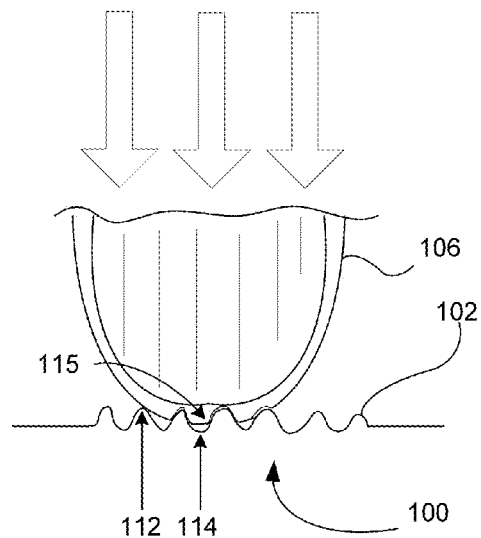
FIG. 2b is a diagram of a finger pressing a shaped capacitive touch sensor in an embodiment of the disclosure.

FIG. 1 is a perspective view of one configuration of a shaped capacitive touch sensor 100 on a device such as an orb 104. The shaped capacitive touch sensor 100 comprises a series of undulations 102. The undulations 102 can perform a number of functions. The undulations 102 provide enhanced detection of the intensity with which a user's finger 106 is pressing against the shaped capacitive touch sensor 100. The amount of skin of the user's finger 106 that touches the shaped capacitive touch sensor 100 changes in relation to the intensity or pressure applied by the finger 106. As the finger 106 flattens out against the shaped capacitive touch sensor 100 it increases the amount of surface area of skin proximate to the shaped capacitive touch sensor 100, thereby increasing the capacitance in proportion to the increase in surface area. FIGS. 2a and 2b illustrate how a user's finger 106 contacts a small area 113 of the undulations 102 at a light pressure in FIG. 2a, and a larger area 115 with increased pressure in FIG. 2b. As the user's finger 106 presses harder against the shaped capacitive touch sensor 100, not only does the user's finger 106 touch more crests 112 in the undulations 102, but the user's finger 106 conforms into the spaces, or depressions 114, between the undulations 102 thereby increasing the capacitance detected by the shaped capacitive touch sensor 100.

Figure 3A:
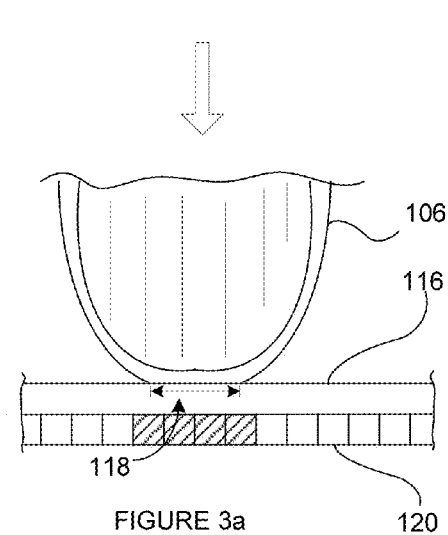
FIG. 3a is a diagram of a finger touching a prior art capacitive touch screen.
Figure 3B:
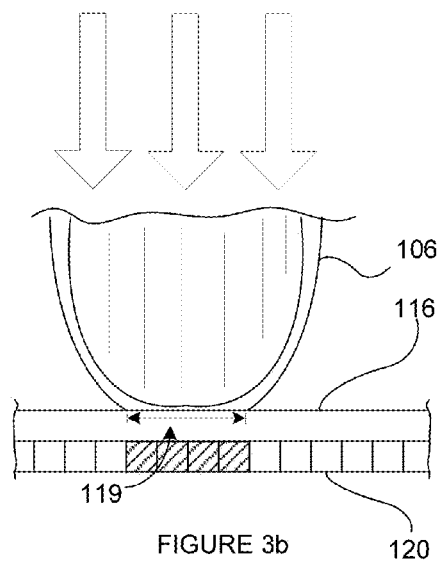
FIG. 3b is a diagram of a finger pressing a prior art capacitive touch screen.

By comparison, most prior art capacitive touch screens 116, such as those illustrated in FIGS. 3a and 3b, are designed to be flat, for example so that visual displays can be placed under the prior art capacitive touch screen 116. In applications where there is a visual display, the prior art capacitive touch screen 116 are typically flat and transparent to prevent distorting images displayed on the visual display. The capacitive touch screens 116 are typically polished smooth for esthetic reasons, but also because the smooth surface facilitates cleaning of the capacitive touch screen 116, for example by wiping the smooth flat surface with a tissue or piece of cloth. Further, many capacitive touch screens 116 are multi-touch touch screens and use an array of capacitive touch element cells 120. However, because the prior art capacitive touch screen 116 is flat, a user who presses harder on the prior art capacitive touch sensor 116 only slightly increases the initial area of contact 118 of their finger 106 as illustrated in FIG. 3a to the somewhat larger area of contact 119 when the finger 106 is exerting greater pressure as illustrated in FIG. 3b. Further, when a user even lightly presses their finger 106 against the capacitive touch screen 116, there is an initial pressure that flattens out the tip of the finger 106, and further pressure only somewhat increases this initial area of contact 118. Moreover, there may be an initial pressure that is required in order to register a touch of the finger, further flattening out the tip of the finger 106.

As a result, the change in capacitance due to the increase in pressure can be difficult to measure with as much accuracy and range as can be measured using the shaped capacitive touch sensor 100. When the prior art capacitive touch screen 116 uses a layout with an array of capacitive touch element cells 120, the incremental increase in capacitance due to an increase in pressure can depend on the relative positions of the finger 116 and cell boundaries, thereby making it difficult to accurately determine differences in pressures applied by a finger 106. This is illustrated in the shaded capacitive touch element cells 120 in FIGS. 3a and 3b where, due to the relative positions of the finger 106 and the array of capacitive touch element cells 120, the same capacitive touch element cells 120 register the pressing of the finger 106 despite differences in pressures being applied.

Referring again to FIGS. 1, 2a and 2b, in configurations, the shaped capacitive touch sensor 100 uses a single monolithic touch sensor. In configurations, the shaped capacitive touch sensor 100 uses a plurality of touch sensors organized into cells with the capacitance of each cell being individually determined. In configurations, the shaped capacitive touch sensor 100 uses cells that allow the capacitance of one or more crests 112 or depressions 114 to be individually determined. In configurations, the undulations 102 are uniform, non-uniform, wave-like or corrugated in a vertical orientation, have an approximately S-wave pattern in an approximately horizontal or planar orientation, are aligned in approximately parallel lines, are spherically aligned from a common center point, or are patterned in a horizontal or planar orientation. In configurations, the undulations 102 have vertical characteristics such as alternating half-circles for each crest 112 and depression 114, an approximately sinusoidal pattern, a square wave like pattern, an approximately sawtooth pattern, an approximately triangular pattern, and any other repeating or non-repeating geometric pattern for improving detection of the intensity of a pressure asserted by a finger 106 onto the shaped capacitive touch sensor 100. The undulations can be modified, arranged, organized, or varied to maximize capacitance changes due to fingerprints, finger shape, or other physical criteria. The undulations can also be arranged, organized, or varied to affect other desirable attributes, such as enhancing the capacitive differences due to size fingers to increase the ability to perform user identification or to customize the shaped capacitive touch sensor 100 for a particular use.

In a non-limiting example, a shaped capacitive touch sensor 100 can be constructed by shaping at least a portion of a piece of plastic to have the desired undulations 102. The piece of plastic can be shaped using a pressure mold, by using a cutting tool to create the desired shape and surface to the plastic, by directly forming the plastic, for example using a Stratysys™ 3D printer, or other means as would be understood in the art. Then, all or some of the portions of the undulations 102 are coated with a silver conductive paint, for example using an alcohol-based paint having a high concentration of silver metal particles in suspension for metal plating on plastic substrates such Silva Spray™ from Caswell Plastics™. The center conductor of a cable, such as a thin coaxial cable, is electrically connected to the silver conductive paint. Epoxy is then placed over the silver conductive paint to protect and insulate the conductive paint from the user's fingers 106. The silver conductive paint is energized using a supply signal, such as low-energy radio-frequency waves. In one configuration, the supply signal is a 120 kHz radio wave. A user's fingers 106, when resting on the epoxy in close proximity to the silver conductive paint, cause changes in capacitance that can be measured. The capacitance can be measured by detecting changes in the phase and amplitude of the return signal from the 120 kHz radio waves that energized the silver conductive paint.

The undulations 102 also provide a haptic surface 110 that provides the user with a tactile feel that is different from the orb 104 or surrounding surface. The haptic surface 110 has the advantage of providing feedback to the user that their fingers 106 are contacting, touching, or pressing the shaped capacitive touch sensor 100 and not touching, for example, the orb 104. The haptic surface 110 can also provide additional grip or friction, enhancing the user's ability to grip and hold the orb 104. The haptic surface 110 can also provide a feedback indication to the user regarding the pressure intensity they are applying to a device such as the orb 104. In configurations the shaped capacitive touch sensor 100 and haptic surface 110 are coincident, or in other words the shaped capacitive touch sensor 100 and the haptic surface 110 are the same size and shape. In other configurations the shaped capacitive touch sensor 100 and the haptic surface 110 can be different sizes and shapes. For example the shaped capacitive touch sensor 100 can be a circle and the haptic surface 110 can be a square, or the shaped capacitive touch sensor 100 can be larger or smaller than the haptic surface 110, or the haptic surface 110 can be an annular ring around the shaped capacitive touch sensor 100. Other configurations are also considered as would be understood by one familiar in the art.

Figure 4:
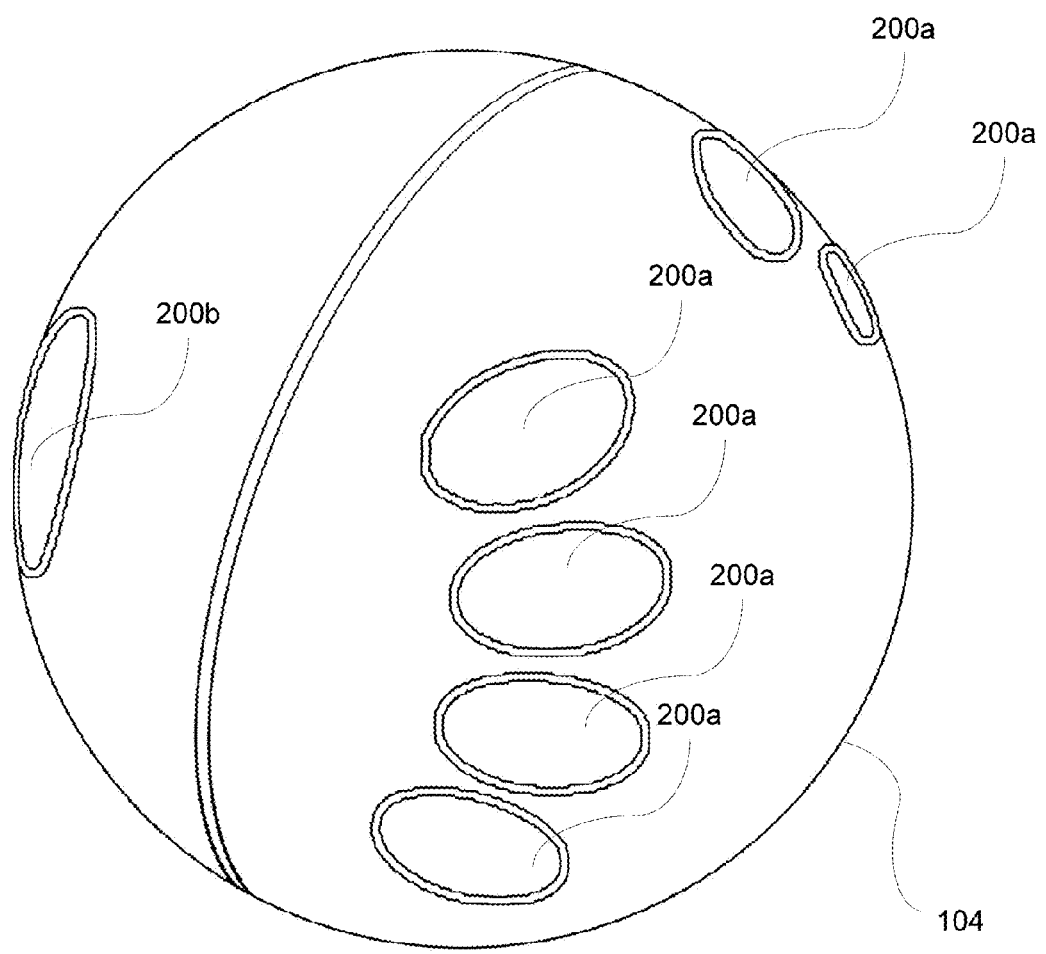
FIG. 4 is a perspective view of an apparatus having capacitive touch sensors in an embodiment of the disclosure.

Referring now to FIG. 4, an orb 104 orb 104 is presented. In a configuration, the orb 104 orb 104 comprises a plurality of touch sensors 200a and 200b (collectively touch sensors 200) each positioned approximately where a user's fingertip or thumb would rest on the orb 104 orb 104 if holding the orb 104 orb 104. In a configuration, there are two thumb touch sensors 200b and eight fingertip touch sensors 200a. In configurations, there are fewer than ten touch sensors 200. In configurations, the touch sensors 200 are configured to provide an indication of the pressure applied by a user's fingers.

In a configuration, the orb 104 orb 104 can be transparent, translucent, opaque, and any color or combination of colors. The orb 104 orb 104 provides touch sensors 200 for a user to manipulate in order to interact with an electronic system. In a configuration, the orb 104 orb 104 comprises a non-conductive material and the touch sensors 200 comprise a conductive material. In a configuration, the touch sensors 200 are a conductive material applied to the orb 104 orb 104, for example a conductive paint, that are connected to a sensor using a shielded cable, a flexible circuit, or any other means of electrically conducting signals between the sensor and the touch sensors 200. A computing device, for example a processor, microcontroller, application specific integrated circuit (ASIC); processing logic, analog-to-digital converters; or combination of circuits, converts the electrical impulses and from the sensor or touch sensors 200 into a determination of which parts of the touch sensor 200 are being touch and an associated intensity or pressure of the touch. In a configuration, the touch sensors 200 incorporate a separate sensor for determination of the intensity or pressure of the touch. In a configuration, the touch sensors 200 register both the contact of the touch sensor 200 by a finger 106 and the intensity or pressure of the touch by the finger 106. In a configuration, the computing device interprets the data from the sensor or touch sensors 200. In a configuration, the computing device records the values from the sensor or touch sensors 200 for later analysis, for example by storing the values in memory, such as memory in a processor or microcontroller, random access memory (RAM), static random access memory (SRAM), or dynamic RAM (DRAM).

In a configuration, the orb 104 is constructed by using an approximately six inch plastic sphere having ten $\frac{1}{8}^{th}$ inch holes through which a thin coaxial cable connects to ten acrylonitrile butadiene styrene (ABS) pads that are attached to the plastic sphere. In a configuration, at least a portion of each ABS pad becomes a touch sensor 200. The ABS pads can be flat, button-like, or any other shape. In a configuration, at least a portion of the ABS pad can have undulations 102 allowing it to become a shaped capacitive touch sensor 100. In a configuration, the pad areas are part of the orb instead of separate pads. Also, although the device is described as an orb 104 for clarity of exposition and to provide an example embodiment, it should be noted that different shaped control devices could be utilized, such as a computer mouse, a joystick, a book-shaped device, a cylindrical object, a partial sphere, or any other regular or irregularly-shaped object. An example of generally cylindrical device is described in more detail below with respect to FIG. 7.

To become a touch sensor 200 or shaped capacitive touch sensor 100, each ABS pad is coated with silver conductive paint, and the center conductor of the thin coaxial cable electrically connects to the silver conductive paint. Epoxy is placed over the silver conductive paint to protect and insulate the conductive paint from the user. The silver conductive paint is energized using low-energy radio-frequency waves, for example 120 kHz radio waves. A user's fingers 106, when resting on the epoxy in close proximity to the silver conductive paint, cause changes in capacitance that can be measured.

The capacitance is measured by detecting changes in the phase and amplitude of the return signal from the 120 kHz radio waves that energized the silver conductive paint. A detector circuit can generate a direct current (DC) voltage from the return signal that is approximately inversely proportional to the capacitance. Additional details regarding an example detector circuit is described below with reference to FIG. 8. The DC voltage from the detector circuit can be sampled by an analog-to-digital converter and the digital signal can be processed by a processor, for example by performing filtering or other signal manipulation. Signals from each ABS pad, or processed signals from one or multiple ABS pads, can be transmitted to a computing device. In a configuration, the orb 104 can communicate with the computing device using any sort of wired or wireless interface, for, example using a wired USB cable or using a wireless protocol such as those in the Institute of Electrical and Electronics Engineers ("IEEE") 802-series such as Bluetooth™ (IEEE 802.16) and WiFi™ (IEEE 802.11), and Infrared Data Association (IrDA) protocol among others.

In a configuration, the orb 104 can be powered by a battery, for example a rechargeable battery. In a configuration, the orb 104 can be powered or charged using a cable, for example the USB cable connected to the computing device. Those of ordinary skill in this area will recognize from reading this disclosure that other types of batteries and power sources (such as a solar cell or a super capacitor) may be used in different configurations as desired, needed, or appropriate.

In operation, when a user presses on the touch sensors 200 of the orb 104, changes in the amount of skin pressing against the touch sensors 200 also changes. The sensor or processor in the orb 104 detects these differences in the amount of skin as changes in capacitance. In configurations, the sensor or processor in the orb 104 detects changes in electrical resistance. Because the user is holding the orb 104 using multiple fingers, a pressure exerted by one or more fingers 106 also creates a corresponding pressure by the other fingers. The orb 104 advantageous allows the user's hands to assume a natural shape or natural position, thereby reducing stress on tendons and musculature of the wrist, hand and fingers. The orb 104 can correlate the various pressures exerted by a subset or all of the fingers to determine how the touch sensors 200 were touched by the user. The orb 104 or a separate application running on an electronic device or computer can perform actions based on the user's interactions with the orb 104, thereby providing an illusion to the user of a causal link between the user's action of squeezing or pressing on the orb 104 and the effect on the orb 104, electronic device, or computer.

In a configuration, the touch sensors 200 are the shaped capacitive touch sensors 100 of FIG. 1. Generally, coarse undulations 102 or textures in the shaped capacitive touch sensor 100 produce greater variations in the amount of capacitance between a resting state when the orb 104 is resting lightly in the user's fingers or hands, and a state of increased pressure when the user is pressing on or more of the shaped capacitive touch sensors 100. Capacitance measurements can vary from user to user, based in part on skin differences, finger shape differences, hand size differences, and the way a particular user holds the orb 104. The individual touch sensors 200 and the orb 104 can be zeroed or initialized as part of an initializing step. In a configuration, touch sensors 200 and the orb 104 can be customized for use by a particular user. In a customization process, the user holds the orb 104 and initiates an initializing step that determines the initial capacitance for each of the touch sensors 200. In another customization step, a number of measurements are taken while the user holds the orb 104 and presses various touch sensors 200 of the orb 104. A profile of the various measurements for the user can be stored can be stored for future use. The user can retrieve the profile at a later time to retrieve the previous measurements. In a configuration, the orb 104 can automatically determine which user is using the orb 104 by measuring the capacitances of the touch sensors 200 and comparing them with the stored profiles of users. A user's profile can be determined, for example, by having the user hold the orb 104, or by having the user perform a number of initial interactions with the orb, such as holding and then pressing one or more touch sensors 200 of the orb 104, or performing a signature way of interacting with the orb 104 such as drumming the fingers against the touch sensors 200 in a characteristic pattern or predetermined order.

In configurations, one or more of the touch sensors 200 of the orb 104 are pressed to interact with electronic systems such as computers and consumer devices, including but not limited to television set top boxes. The translation from the pressing of touch sensors 200 to the code or command for control of a specific operation of the electronic system can be performed by a computing device in the orb 104, by computing devices in communication with the orb 104, or by the electronic system itself. For example, pressing individual touch sensors 200 can be translated into a click of an on-screen button. In this example, the orb may be in communication with a customized device driver in a computer, and the computer may be running a web browser or application. In another example, pressing and releasing multiple touch sensors 200 can be translated into Braille chords. In another example, pinching the orb 104 with the thumb and the index finger 106 of the same hand is a gesture that can indicate that something is to be picked up, and can be translated into the cut command of a cut-and-paste command, or can be translated into a picking up gesture, such as picking up a cursor or an icon. In a related example, squeezing with multiple, opposing fingers 106 can indicate that something is to be grabbed, and can be translating into a drag operation, for example dragging an item across a screen. In another example, squeezing with the fingers 106 of the left hand can be translated into a left mouse click, while squeezing with the fingers 106 of the right hand can be translated into a right mouse click. In another example, drumming the fingers 106 in sequence on the touch sensors 200 can be translated into a scroll up or scroll down function depending on the order in which the fingers 106 are drummed.

Non-limiting example applications for the orb 104 and touch sensors 100, 200 include a Braille keyboard, an input device for the blind, a music controller, a fly-by-wire controller, a home theater controller, an interactive controller for an exhibit, for example a museum exhibit, a fitness, training, or rehabilitation device, and a controller device for dark or hazardous environments. For example, home theater controllers are typically IrDA remote controls that have limited space for buttons. Game controllers can have even fewer buttons. However, there are new applications for home theaters and game systems such as Hulu™, Netflix™, and other streaming media websites. Remote controls and game controllers can be used to enter text data, but it is slow and often requires pressing the same keys multiple times to cycle through letters. It is also awkward to hold and type with a full qwerty keyboard and use a traditional mouse while relaxing on a couch or sitting in a reclining chair. The orb 104 can provide a customizable controller and interface for controlling these applications and can facilitate text entry.

In another non-limiting example, the orb 104 can provide an intuitive interface for virtual interactions. For example, with the addition of a 3D television or screen, the orb 104 can be utilized to interact virtually with items viewed in the virtual experience. Because the orb 104 with shaped capacitive touch sensor 100 can sense pressures, it is possible to create a spatially-immersive experience where the user can grab objects and manipulate or interact with them. For example, one could pinch the avatar of another user to get their attention, or grab a ball and throw it. In sports and recreation, an orb 104 with shaped capacitive touch sensor 100 can be used to measure and teach proper finger positioning and grip pressures, for example for throwing various kinds of pitches in baseball. In therapeutic environments, an orb 104 can be used by a physician to measure a patient's hand and finger strengths to diagnose neurologic impairment or muscular atrophy. Alternatively, the orb 104 can be used by the patient to monitor and assist the patient in properly performing strength enhancing exercises.

In a configuration, the orb 104 can provide a feedback sense to the user, for example a light emitting diode (LED) indication, an auditory indication from a speaker element, or a vibratory indication from a vibrating motor. For example, the orb 104 can respond to a user pressing on a sensor 200 by producing an audible click. In another non-limiting example, when the user picks up the orb and touches a sensor 200, the orb 104 can respond by activated an LED, thereby providing visual confirmation to the user that the orb 104 is ready for operation or initial user calibration.

Other applications for the shaped capacitive touch sensors 100 include, but are not limited to, membranes for pressure mapping and intimate interfaces. With regards to membranes for pressure mapping, potential applications include analyzing pressure points for seated and supine patients, who can be at significant risk for pressure sores due to long periods of immobility. For example, a pressure mat with shaped capacitive touch sensors 100 can be inserted under the patent to identify pressure points, allowing health care professionals information to move the patient or create customized cushioning to eliminate the pressure points. With regards to intimate interfaces, most currently available devices employ vibratory stimulation. Using shaped capacitive touch sensors 100, any number of textured regions could be formed on the surface of an object, and a computer circuit could interpret changes in pressure against each region, and then use that information to alter the intensity of vibration or do other things in response to user gestures, including squeezing, stroking, or pinching. The vibratory patterns are triggered by the user, producing a feedback loop that can deepen engagement and pleasure. The surface textures can also provide direct tactile sensation simply by their form.

Figure 5:
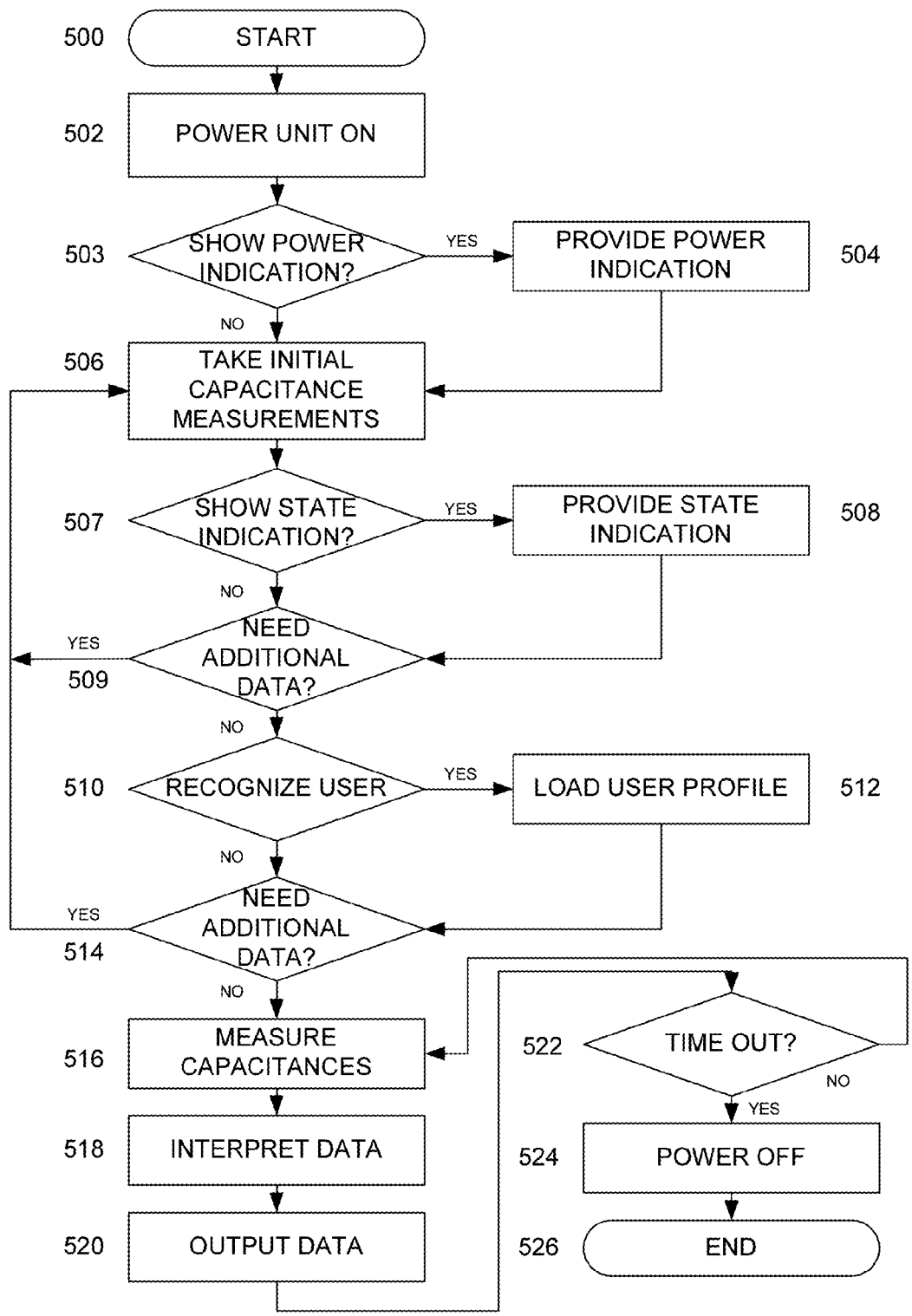
FIG. 5 is a flowchart of the operation of an apparatus using capacitive touch sensors in an embodiment of the disclosure.

Referring now to FIG. 5, an exemplary flowchart of the operation of an orb 104 and shaped capacitive touch sensor 100 is presented. Operation starts with process block 500 labeled START. Processing continues to process block 502 where the orb 104 is powered on, either by a user or connected computing system powering on the device, or by a user touching the orb 104 such as by picking the orb 104 up. Processing continues to decision block 503. If no power indication is provided to the user, then processing continues to process block 506, otherwise processing proceeds to process block 504 before continuing to process block 506. In process block 504, the orb 104 provides a power indication to the user that the orb 104 is powered on, for example by activating an LED, playing an audible sound, vibrating or any combination thereof. The orb 104 may also send a signal to a computing device to indicate that the orb is on or to provide current state information, for example using wired or wireless communications. Processing then continues to proceeds to process block 506.

At process block 506, the orb 104 performs one or more initial measurements of the capacitance at one or more sensors 200. In a configuration, processing may remain at processing block 506 until the orb 104 determines that a user is attempting to operate the orb 104. For example, the orb 104 may take initial measurements until there is a capacitive change in one or more of the touch sensors 200 that is indicative of a user holding the orb or pressing on the touch sensors 200. In another non-limiting example, the orb 104 may require the user to concurrently press several or all of the touch sensors 200 to activate the orb 104. This concurrently pressing of the touch sensors 200 can also be part of a zeroing process or a dynamic range sensing process. Processing continues to decision block 507.

In decision block 507, if no current state indication is provided to the user, then processing continues to decision block 509, otherwise processing proceeds to process block 508 before continuing to decision block 509. In process block 508, a current state indication is provided to the user. The orb 104 can activate an LED, play an audible sound, vibrate, or send a signal to a computer to indicate the current state of operation. Processing then proceeds to decision block 509. In decision block 509, if additional initial measurements are required, processing returns to process block 506, otherwise processing continues to decision block 510.

In a non-limiting example of an initial measurement, to perform a zeroing process decision block 507 directs processing to process block 508 where the orb 104 provides an indication for the user to remove their fingers 106 from the touch sensors 200 so that the orb 104 can take capacitance measures of the touch sensors 200 without the user touching the touch sensors 200. Processing continues to decision block 509, where processing is directed back to process block 506 so that initial measurements can be taken. Processing continues from process block 506 to decision block 507 where processing is directed again to process block 508 and the orb 104 provides an indication that the user is to hold the orb 104 with fingers 106 on the touch sensors. Processing then continues to decision block 509, where processing is directed back to process block 506 where another set of initial measurements are taken of the capacitances, this time when the orb 104 is being held by the user. Either or both of the initial measurements with fingers 106 off of the touch sensors 200 or on the touch sensors 200 can be used in the zeroing process to obtain a set of initial measurements of capacitances. The orb 104 can later determine whether a user is pressing on a touch sensor 200 by comparing with the initial or zeroed capacitances with the current capacitance.

In an optional dynamic range sensing process, decision block 507 directs processing to process block 508 where the orb 104 provides an indication to the user that the user is to press firmly against the touch sensors 200. Processing continues to decision block 509, where processing is directed back to process block 506 and a set of initial measurements are taken of the high range of capacitances for a user who presses the touch sensors 200 firmly. The orb 104 can use the high range of the capacitances along with the initial measurements of capacitances to determine the dynamic range of a particular user.

In an optional user identification process, decision block 507 directs processing to process block 508 where the orb 104 provides an indication to the user to instruct the user to press against the touch sensors 200 in a predetermined or characteristic way. Processing continues to decision block 509, where processing is directed back to process block 506 and a set of capacitance measurements are taken over a period of time to capture a user's signature way of interacting with the touch sensors 200 of the orb 104.

For purposes of convenience only, the optional processes above are described as decision block 507 that directs processing to process block 508 where the orb provides an indication to the user and decision block 509 that directs processing to process block 506 where capacitance measurements are taken. It should be noted that there is no implied order in the zeroing process, the dynamic range sensing process, or the user identification process. Any or all of those processes can be performed in any order. Also, it should be noted that all of the measurements in those optional processes can be performed without the requirement of first providing a separate indication in either of optional process blocks 504 and 508. Further, all of the processes can be performed in process block 506 before proceeding to decision block 507. For example, after the power is turned on in process block 502 processing continues through process block 503 to process block 506. In process block 506, the orb 104 performs capacitive measurements over a period of time while the user performs one or more of the following: touching the orb 104 without touching the touch sensors 200, holding the orb 104 while touching the touch sensors 200, pressing firmly against one or more of the touch 200, and performing a signature set of touches of one or more of the touch sensors 200. From these capacitive measurements of the various ways the user interacted with the orb, the orb determines one or more of the following: the initial measurements of capacitances for the orb 104, the initial measurements of capacitances for the user, the high range of capacitances for the user, and the signature set of touches by the user.

After the initial measurements, processing continues to decision block 510. At optional decision block 510 the orb 104 determines if a user can be identified either from a signature set of touches by the user, or by comparing stored user profiles with one or more of the following: the initial capacitance measurements, the high range of capacitance measurements, the dynamic range of capacitance measurements, or any combination or permutation thereof. If the user is identified, processing continues to process block 512 where a profile of settings and customizations can be loaded for the user, and thereafter processing continues with process block 516. If a user can not be identified, then processing continues to decision block 512 to determine if additional measurements need to be taken to further calibrate the touch sensors 200 of the orb 104. If additional measurements are required, then processing returns to process block 506. If no additional measurements are required, then the orb uses either a default configuration or the initial capacitance measurements and the dynamic range measurements if known, and processing continues to process block 514.

In process block 514, the orb 104 can continuously take capacitance measurements of the touch sensors. In configurations, the rate at which the orb 104 takes capacitive measurements can be dynamically determined by the system with which the orb 104 is communicating, and therefore be context driven by the particular application. For example, if the orb 104 is being used as a remote control for a television set top box and the orb 104 is battery powered, then the sampling rate can be adjusted to conserve power while being sufficiently responsive to timely register any presses of the touch sensors 200 by the user. In a configuration, the sampling rate can dynamically increase after the first detection of a touch sensor 200 being touched by a user's finger 106, and dynamically decrease after the user stops touching the orb 104. In another application, if the orb 104 is powered by a USB connection to a computer and is being used to control action in a gaming application, then the sampling rate can be adjusted to a higher rate to increase responsiveness. Processing continues to processing block 518.

In optional processing block 518, one or more presses of the touch sensors 200, if captured, are interpreted by the orb 104 into data. The presses of the touch sensors 200 by the user's fingers 106 can be converted into binary on/off data based on whether a threshold pressure was exceeded. In configurations, the presses can be debounced if turned into binary data. The presses of the touch sensors 200 by the user's fingers 106 can be scaled to a proportional value data. For example, the capacitance measurements can be scaled using any combination of the previously determined dynamic range, a linear scaling factor, a logarithmic scaling factor, a curvilinear scaling factor, or a non-linear scaling factor. Once the presses are interpreted, processing continues to process block 520.

In process block 520, the data is output to an electronics system, for example a computer or a television set top box. Processing continues to decision block 522. In decision block 522, if a user is currently pressing touch sensors 200 or if the touch sensors 200 have been pressed within a predetermined time, then processing returns to process block 516. If no presses of the touch sensors 200 have been detected by the orb 104 within a predetermined time, processing continues to process block 524. In optional process block 524 the orb powers off. Operation concludes with process block 526 labeled END.

Figure 6A:
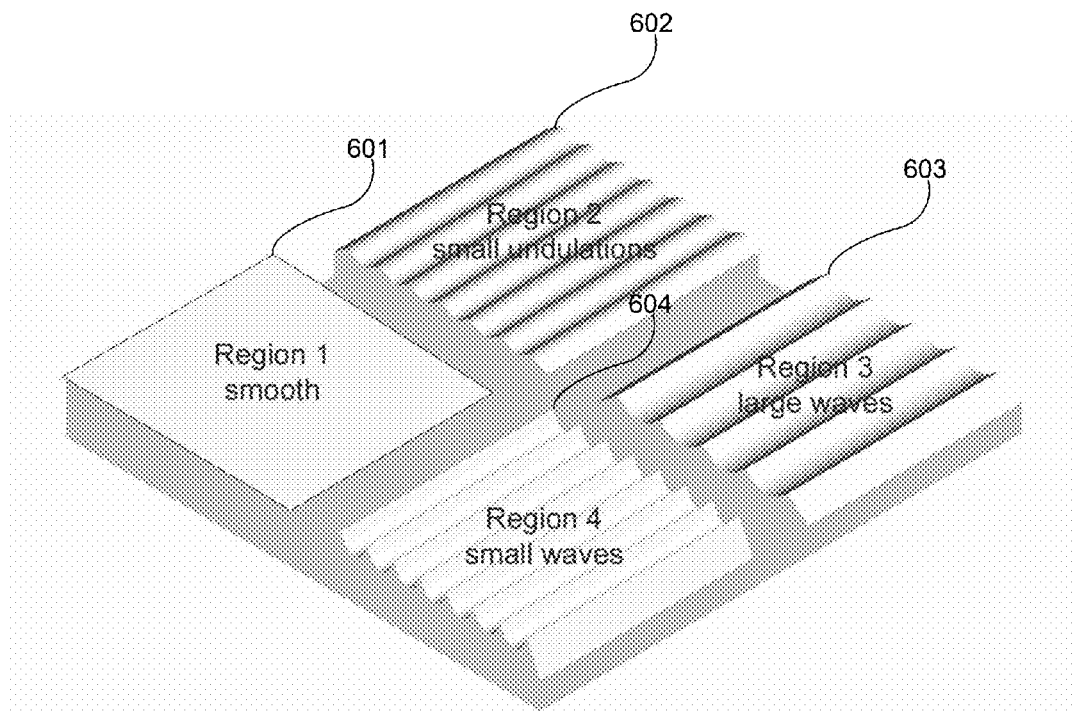
FIG. 6a is a perspective diagram of several test configurations of shaped capacitive touch sensors.
Figure 6B:
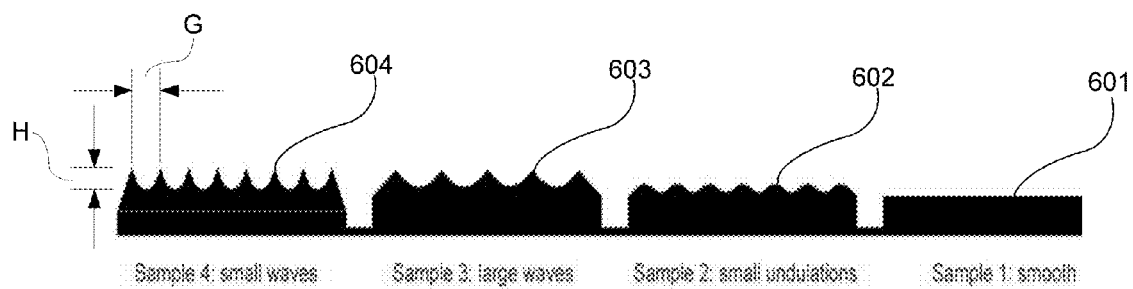
Figure 6C:
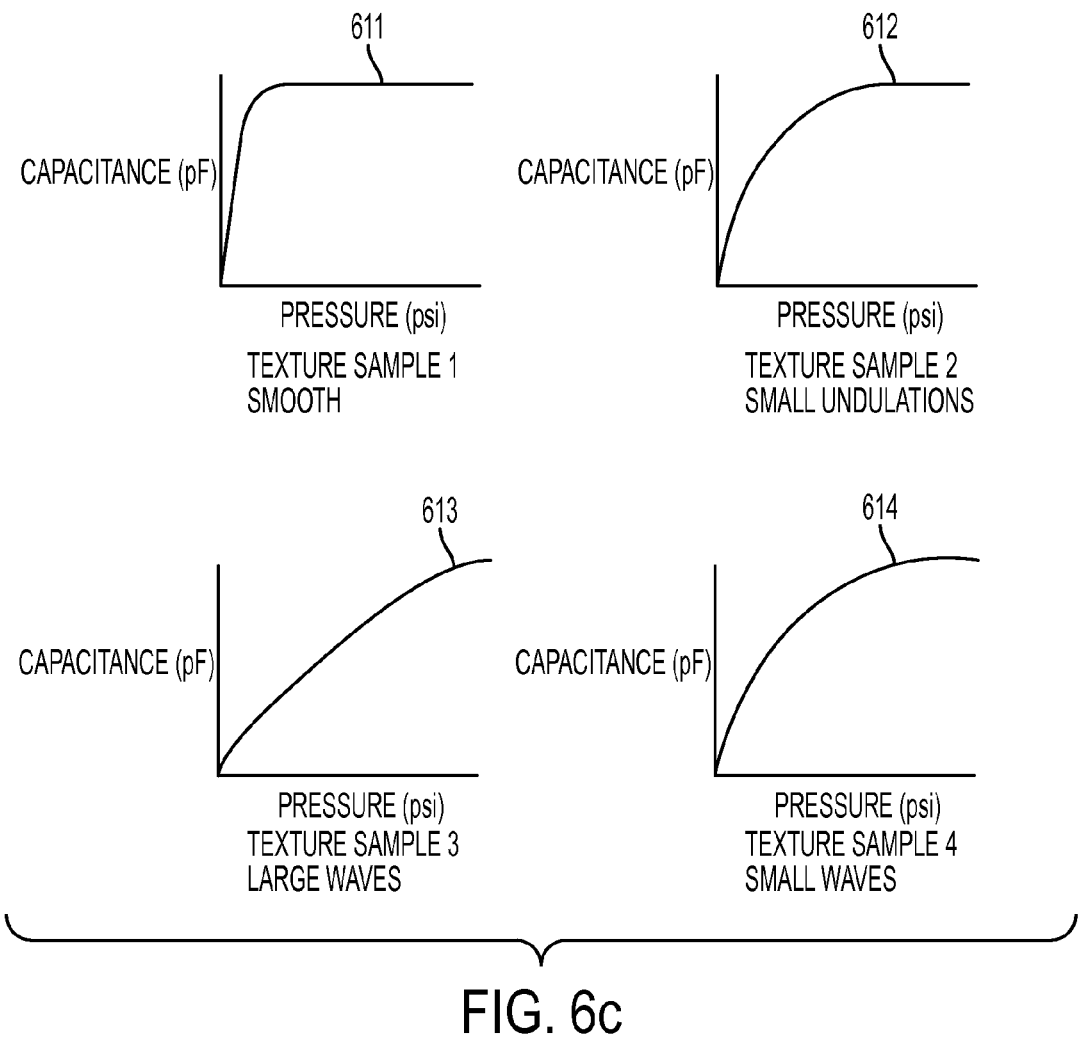
FIG. 6c is a set of graphs of pressure vs. capacitance for the shaped capacitive touch sensors of FIGS. 6a and 6b.

Referring now to FIGS. 6a, 6b, and 6c, test configurations of shaped capacitive touch sensors 100 are presented. For simplicity of testing, the regions 601, 602, 603, 604 are constructed with undulations uniformly modulated along a single axis, however other shapes and patterns are also contemplated as described above. In a first region 601, shown in perspective view in FIG. 6a and side view in FIG. 6b, the sensor region is flat and smooth. In the first region 601, the amount of skin touching the surface quickly reaches a maximum with very little pressure. The pressure vs. capacitance curve 611 for the first region 601 is illustrated in FIG. 6c. In a second region 602, the skin area contacting the small undulations reaches the maximum with the user presses hard and the skin fills in the troughs between the crests. The pressure vs. capacitance curve 612 for the second region 602 is illustrated in FIG. 6c. In a third region 603, with light pressure the skin rests on the crests of the large waves, so that only a small amount of skin comes into contact initially, but with greater pressure the skin fills in the troughs between the crests of the waves. The pressure vs. capacitance curve 613 for the third region 603 is illustrated in FIG. 6c. In the fourth region 604, with light pressure the skin rests on the crests of the small waves, but with greater pressure the skin begins to fill in the troughs between the crests of the waves, and as pressure increases more of the skin fills in the troughs. The fourth region 604 senses the initial touch of skin as well as capacitance that varies approximately proportionally with the force applied by the skin. The pressure vs. capacitance curve 614 for the third region 604 is illustrated in FIG. 6c. In a configuration, the small waves of region 604 are approximately ⅛ of an inch wide, from crest to crest (shown as "G"), and approximately 0.07 inches deep, from crest to trough (shown as "H"), and are shaped with a pointed crest and a curving trough. In some configurations, gap "G" can be in the range of about 0.1" to about 0.30". In some configurations, gap "G" is about 0.25". In some configurations, height "H" can be in the range of about 0.1" to about 0.30". In some configurations, gap "H" is about 0.25". In some configurations G and H are about equal, in other configurations G and H are not equal.

Figure 7A:
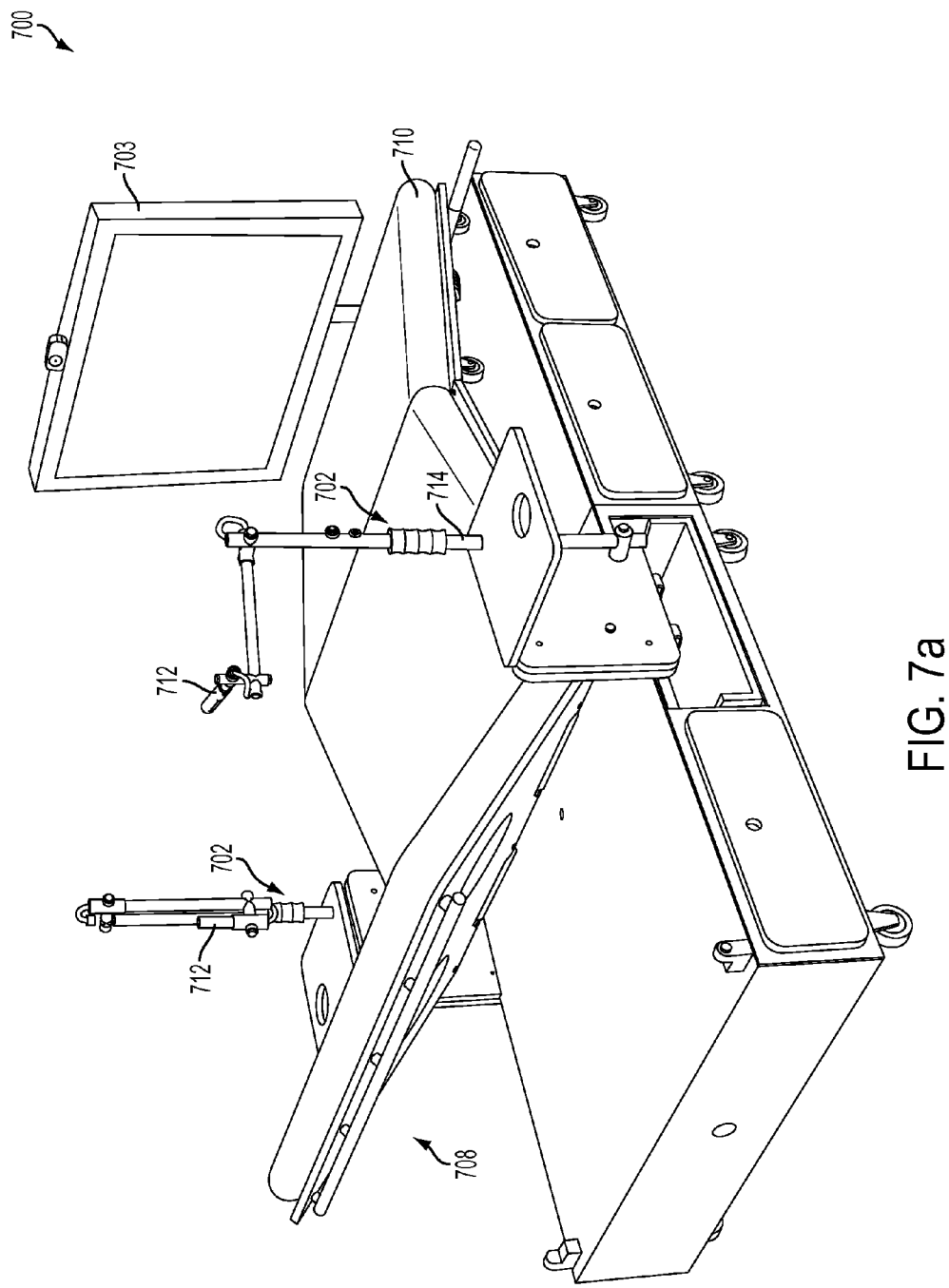
FIG. 7a is an example configuration of an apparatus utilizing a control device.

Referring now to FIG. 7A, an example configuration of an apparatus 700 utilizing a control device 702 is shown. The control device 702 can incorporate features described above with regard to orb 104. The control device 702 can be positioned on any portion of the apparatus 700 such that it is accessible by a user. In the illustrated embodiment, the control device 702 is coupled to the post 714 such that it is accessible by a user sitting on the apparatus 700. While the apparatus 700 is shown utilizing two control devices 700 (one for each hand of the user, for example), it is to be appreciated that any suitable number of control devices 702 can be associated with the apparatus.

As shown, the apparatus 700 can comprise various controllable components, such as a display 706, an adjustable backrest 708, an adjustable leg rest 710, and lights 712, for example. User interaction with the control device 702 can operate, control or otherwise adjust the controllable components. Example operations can include, changing a channel on the display 706, adjusting the volume of the display 706, adjusting an angle of the adjustable backrest 708 or adjustable leg rest 710, and controlling the light 712, and so forth. The control device 702 can be coupled to the various controllable components through any suitable interface, such as a wired interface, a wireless interface, or a hybrid wired and wireless interface. Moreover, a first set of controllable components can be in communication with the control device 702 via a first interface, while a second set of controllable components can be in communication with the control device 702 via a second interface. The control device 702 can also be coupled to controllable components that are independent from the apparatus 700, such as overhead lighting a sound system, personal computer, home automation technologies, or home theater technologies, for example.

FIG. 7B and FIG. 7C illustrate example configurations of control device 702. The control device 702 can be in communication with the controllable components via leads 750. As illustrated, the leads 750 can be routed through the post 714 to the various components. In other configurations, the leads 750 can be routed via any suitable routing path. The control device 702 can comprise a plurality of contours 718 that are configured to individually accept a user's figures. As is to be appreciated, other configurations are possible, such as a groove for a user's thumb or a pad for the user's palm, for example. In some configurations, the control device 702 is rotatable around the post 714 and/or vertically slidable along the post 714.

Referring first to FIG. 7B, the control device 702 can comprise a plurality of touch pads 720, with one touch pad 720 positioned within each contour 718. Touch pads 720 can be similar to touch sensors 100 described above having a series of undulations 102. The touch pads 720 can be peripherally positioned such when a user is occupying the apparatus 700 and gripping the control device 702, their fingertips will naturally be positioned proximate the touch pads 720.

Referring now to FIG. 7C, a control device 702 comprising a plurality of touch bands 722, with one touch band 722 positioned within each contour 718. The touch bands 722 can be similar to the touch sensors 100 described above having a series of undulations 102. The touch band 722 can wrap around the entire periphery, or nearly the entire periphery, of the contour 718.

The touch pads 720 and the touch bands 718 can be operated similarly to the flowchart shown in FIG. 5. For example, a user sitting in the apparatus 700 can utilize a variety of interactions with one or more control devices 702 to operate associated controllable components. In one configuration, drumming the fingers along the touch pads 720 of the control device in a user's right hand will change the channel of the display 706, while drumming the fingers along the touch pads 720 of the control device in a user's left hand will change the volume of the display 706. A rapid press and release of all four touch pads 720 simultaneously can turn the light 712 on or off. As is to be appreciated, a wide array of commands that can be based on the mere presence of some pressure, or based on the amount of pressure, can be used to control the controllable components associated with the apparatus 700.

Figure 8:
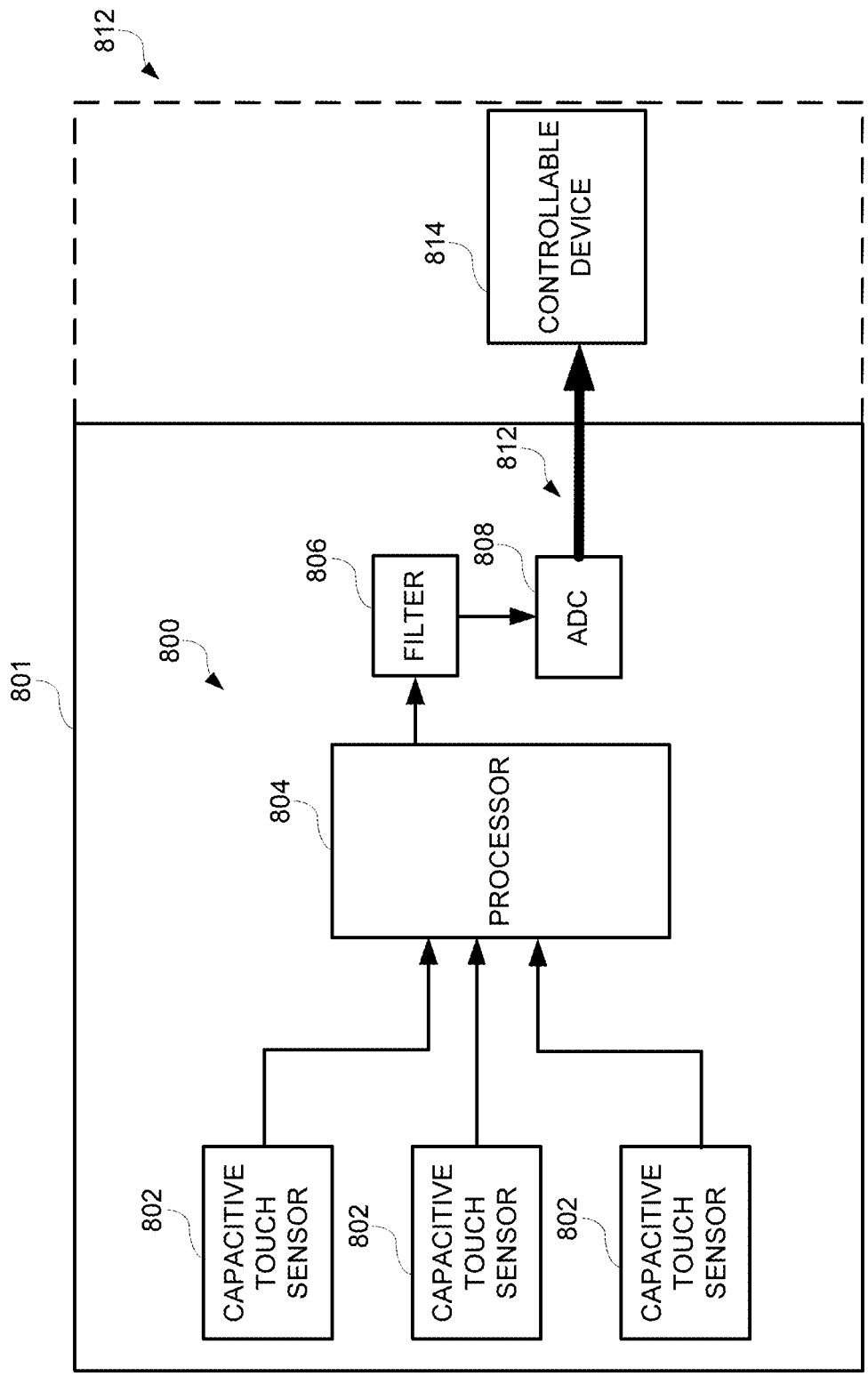
FIG. 8 is a functional representation of an example detector circuit.

FIG. 8 shows an example functional representation of a detector circuit 800 that is associated with a control device 801. The control device 801 can be any suitable device or object that includes capacitive touch sensors 802, such as an orb, a joystick, or a cylindrical object, for example. The control device 801 can be similar to the control device 702 or orb 104, for example. The capacitive touch sensors 802 can be positioned on the control device 801 such that they can receive a variable force exerted by the fingers of a user that is holding, operating or otherwise manipulating the control device 801. While three capacitive touch sensors 802 are shown in FIG. 8, any suitable number of capacitive touch sensors 802 can be utilized, such as 1, 5, or 10 or more, for example. In any event, a capacitance value for each capacitive touch sensors 802 can be provided to a processor 804. As described above, the capacitance value can vary as a function of the force exerted on the capacitive touch sensors 802 by the user. Upon receiving a capacitance value from one or more of the capacitive touch sensors 802, the processor 804 can generate an output voltage that is generally proportional to the received capacitance value. The processor 804 can be any suitable processor or microcontroller, such as a MC33941 electronic field imaging device offered by FREESCALE SEMICONDUCTOR, for example. In some configurations, the voltage generated by the processor 804 can then by filtered, or otherwise conditioned, by a filter 806. Any suitable filtering or conditioning process can be used. In one configuration, the filter 806 is a $2^{nd}$ order Butterworth filter having a cutoff frequency of about 30 kHz. Next, the filtered voltage can be provided to an analog-to-digital converter 808. The analog-to-digital converter 808 can be any suitable analog-to-digital converter, such as an MCP3204 12-bit Analog-to-Digital Converter offered by MICROCHIP, for example. The digital signal output 812 of the analog-to-digital converter 808 can be supplied to any controllable device 814. The digital signal output 812 can be provided to the controllable device 814 via any suitable interface such as a wired interface, a wireless interface, or a combination of wired and wireless interfaces. In some configurations, the controllable device 814 is incorporated with, internal to, or otherwise directly coupled with, the control device 801, as illustrated by dashed lines 812. These and other embodiments of the shaped capacitive touch sensor 100 and orb 104 can be used as an enhancement over current computing device controllers or remote control devices as would be recognized by those skilled in the art. The above descriptions of various components and methods are intended to illustrate specific examples and describe certain ways of making and using the devices disclosed and described here. These descriptions are neither intended to be nor should be taken as an exhaustive list of the possible ways in which these components can be made and used. A number of modifications, including substitutions of components between or among examples and variations among combinations can be made. Those modifications and variations should be apparent to those of ordinary skill in this area after having read this document.

What is claimed is:

1. A touch sensor, comprising:
    a conductive layer;
    a conductor coupled to the conductive layer and configured to energize the conductive layer with a supply signal;
    a non-conductive layer, the non-conductive layer comprising a plurality of undulations defining a plurality of crests and a plurality depressions, wherein the plurality of crests and the plurality of depressions collectively define a surface area; and
    a detector circuit, the detector circuit configured to receive a return signal from the conductive layer, the return signal varying when the plurality of undulations are touched, wherein the return signal varies in relation to an amount of the surface area that is touched.

2. The touch sensor of claim 1, wherein the amount of the surface area that is touched is based on a pressure level exerted on the plurality of undulations.

3. The touch sensor of claim 2, wherein the plurality of undulations comprises a plurality of parallel ridges, wherein each ridge is separated from an adjacent ridge by about ⅛".

4. The touch sensor of claim 1, wherein the plurality of undulations are formed in a uniform pattern.

5. The touch sensor of claim 1, wherein the plurality of undulations comprise an approximately sawtooth pattern.

6. The touch sensor of claim 1, wherein the plurality of undulations comprise a plurality of alternating half-circles.

7. The touch sensor of claim 1, wherein the supply signal is a radio wave.

8. The touch sensor of claim 7, wherein the radio wave has a frequency of approximately 120 kHz.

9. The touch sensor of claim 1, wherein the non-conductive layer is an epoxy.

10. The touch sensor of claim 1, wherein the conductive layer comprises a silver conductive paint.

11. A control device, comprising:
    a controller having an outer surface;
    a first and second pad positioned proximate the outer surface, wherein the first pad comprises a first set of undulations and the second pad comprises a second set of undulations, wherein the first set of undulations define a first plurality of crests and a first plurality depressions, wherein the first plurality of crests and the first plurality depressions collectively define a first surface area, wherein the second set of undulations define a second plurality of crests and a second plurality depressions, wherein the second plurality of crests and the second plurality depressions collectively define a second surface area;
    the first pad comprising a first conductive layer energizable by a first supply signal;
    the second pad comprising a second conductive layer energizable by a second supply signal; and
    a detector circuit, the detector circuit configured to receive a first return signal from the first pad and second return signal from the second pad, the first and second return signals each varying with a respective force exerted on the first and second pads, wherein the first return signal varies in relation to an amount of the first surface area that is touched and the second return signal varies in relation to an amount of the second surface area that is touched.

12. The control device of claim 11, wherein the controller is selected from the group consisting of one of an orb, a joystick, and a cylindrical object.

13. The control device of claim 12, wherein the first and second pads are positioned on the controller to be touched by a first and second fingertip of a user.

14. The control device of claim 11, comprising a communications interface coupled to the detector circuit.

15. The control device of claim 14, wherein the communications interface is selected from the group consisting of a wired interface and a wireless interface.

16. The control device of claim 11, wherein the first and second set of undulations each comprise a plurality of uniform ridges.

17. A method, comprising:
    when a touch sensor device comprising a touch sensitive sensor is being held by a user in a first state of contact, determining a first capacitance measurement of the touch sensitive sensor, the touch sensitive pad comprising a plurality of undulations defining a plurality of crests and a plurality depressions, wherein the plurality of crests and the plurality of depressions collectively define a surface area;

when the touch sensor device is being held by the user in a second state of contact, determining a second capacitance measurement of the touch sensitive sensor, wherein an amount of the surface area that is touched in the second state of contact is greater than an amount of the surface area that is touched in the first state of contact;

when the touch sensor device is being held by the user in a third state of contact, determining a third capacitance measurement, wherein an amount of the surface area that is touched in the third state of contact is greater than the amount of the surface area that is touched in the first state of contact and less than the amount of the surface area that is touched in the second state of contact; and outputting a command signal based on the third capacitance measurement.

18. The method of claim 17, wherein the touch sensor device is selected from the group consisting of an orb, a joystick, and a cylindrical object.

19. The method of claim 18, wherein each of the plurality of crests has a height.

20. The method of claim 19, wherein the height is about $\frac{1}{8}"$.

* * * * *